United States Patent
Yang et al.

(10) Patent No.: US 9,685,224 B2
(45) Date of Patent: Jun. 20, 2017

(54) MEMORY WITH BIT LINE CONTROL

(71) Applicant: TAIWAN SEMICONDUCTOR MANUFACTURING COMPANY, LTD., Hsinchu (TW)

(72) Inventors: Chen-Lin Yang, Zhubei (TW); Cheng Hung Lee, Hsinchu (TW); Hung-Jen Liao, Hsinchu (TW); Kao-Cheng Lin, Taipei (TW); Jonathan Tsung-Yung Chang, Hsinchu (TW); Yu-Hao Hsu, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/713,648

(22) Filed: May 15, 2015

(65) Prior Publication Data
US 2016/0111142 A1    Apr. 21, 2016

Related U.S. Application Data

(60) Provisional application No. 62/065,589, filed on Oct. 17, 2014.

(51) Int. Cl.
G11C 5/14       (2006.01)
G11C 11/417     (2006.01)
G11C 7/12       (2006.01)

(52) U.S. Cl.
CPC ............ *G11C 11/417* (2013.01); *G11C 5/148* (2013.01); *G11C 7/12* (2013.01)

(58) Field of Classification Search
CPC ....................................................... G11C 5/14
USPC .......................................................... 365/227
See application file for complete search history.

(56) References Cited

U.S. PATENT DOCUMENTS

| 7,193,921 B2 * | 3/2007 | Choi ................ G11C 7/20 365/194 |
| 7,272,061 B2 * | 9/2007 | Saleh ............... G11C 16/24 365/156 |
| 7,626,878 B1 * | 12/2009 | Lin .................. G11C 11/413 365/189.14 |
| 8,605,523 B2 | 12/2013 | Tao et al. |

(Continued)

FOREIGN PATENT DOCUMENTS

| KR | 20100022045 | 2/2010 |
| KR | 20140047152 | 4/2014 |

OTHER PUBLICATIONS

Office Action dated Jun. 23, 2016 and English translation from corresponding No. KR 10-2015-0143421.

(Continued)

*Primary Examiner* — Son Mai
(74) *Attorney, Agent, or Firm* — Hauptman Ham, LLP

(57) ABSTRACT

A memory comprises a first set of memory cells coupled between a first data line and a second data line. The memory also includes a first input/output (I/O) circuit coupled to the first data line and the second data line. The first I/O circuit is also coupled to a first control line to receive a first control signal and coupled to a first select line to receive a first select signal. The first I/O circuit is configured to selectively decouple the first data line and the second data line from the first I/O circuit during a sleep mode based on the first control signal and the first select signal.

20 Claims, 13 Drawing Sheets

(56) References Cited

U.S. PATENT DOCUMENTS

| | | |
|---|---|---|
| 8,630,132 B2 | 1/2014 | Cheng et al. |
| 8,675,439 B2 | 3/2014 | Cheng et al. |
| 8,760,948 B2 | 6/2014 | Tao et al. |
| 9,087,564 B2* | 7/2015 | Ashizawa ............... G11C 7/12 |
| 9,196,353 B2* | 11/2015 | Ishii ....................... G11C 7/12 |
| 2001/0028591 A1* | 10/2001 | Yamauchi .............. G11O 5/145 |
| | | 365/227 |
| 2008/0285367 A1* | 11/2008 | Jung ........................ G11C 7/22 |
| | | 365/203 |
| 2010/0254206 A1* | 10/2010 | Campbell ............... G11C 7/12 |
| | | 365/203 |
| 2011/0158021 A1* | 6/2011 | Wiatrowski ............ G11C 7/12 |
| | | 365/203 |
| 2013/0088932 A1* | 4/2013 | Yamagami .............. G11C 5/14 |
| | | 365/203 |
| 2013/0094307 A1* | 4/2013 | Cheng ................. G11C 11/419 |
| | | 365/191 |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2016/0012881 A1* | 1/2016 | Kuo .................... G11C 11/419 |
| | | 365/156 |

OTHER PUBLICATIONS

Office Action dated Jan. 13, 2017 from corresponding application No. TW 104133658.
Notice of Allowance dated Dec. 15, 2016 and English translation from corresponding application No. KR 10-2015-0143421.

* cited by examiner

MEMORY WITH BIT LINE CONTROL

PRIORITY CLAIM

The present application claims priority to U.S. Provisional Patent Application No. 62/065,589, filed Oct. 17, 2014, the entirety of which is incorporated by reference herein.

BACKGROUND

Static random access memory (SRAM) is a type of semiconductor memory that uses bi-stable latching circuitry to store each bit in a memory array. SRAM maintains data in the memory array without the need to be refreshed when powered, but is still volatile such that data is eventually lost when the memory is not powered. Power gating and voltage retention techniques are commonly implemented to the entire memory array to reduce power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
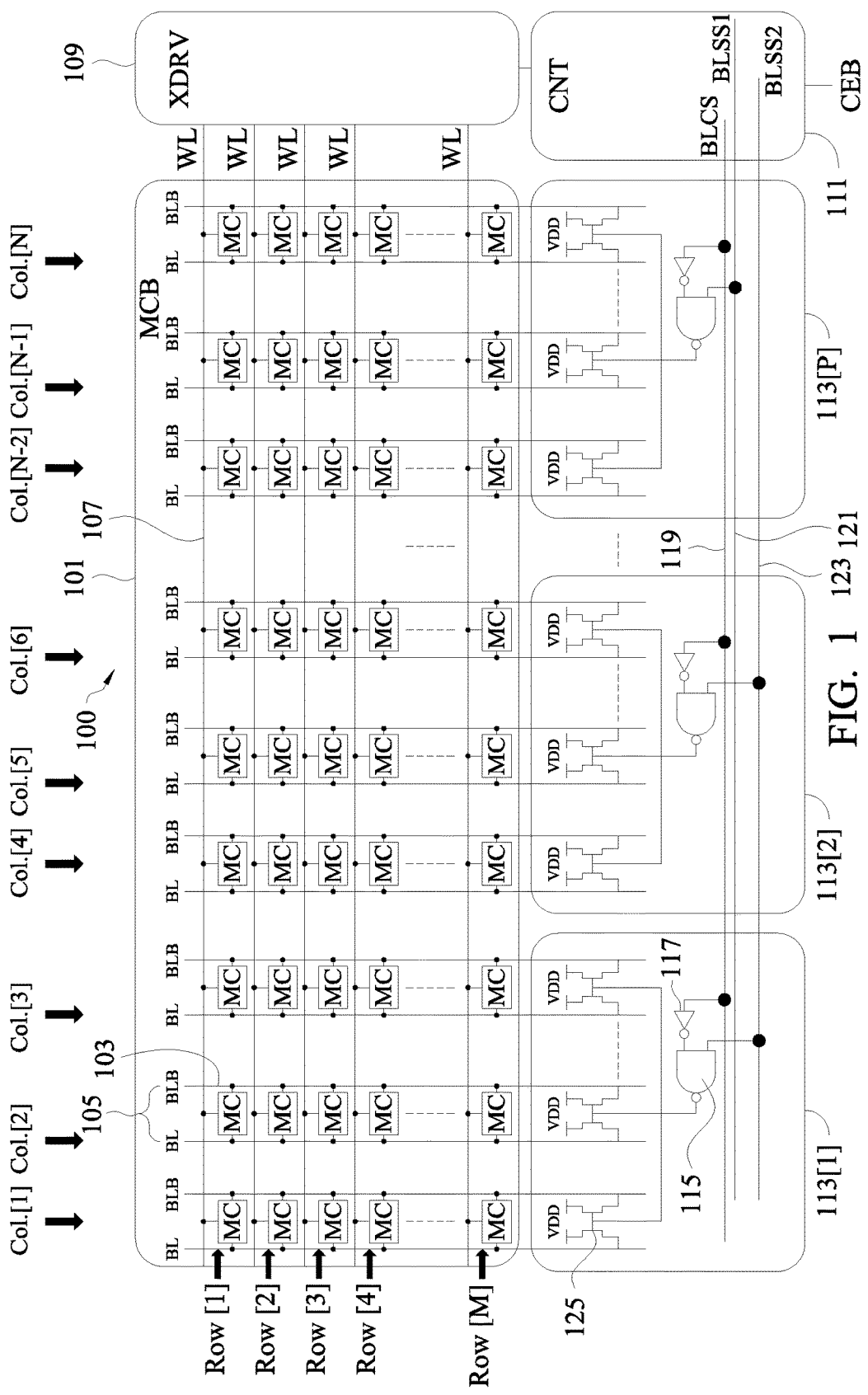
FIG. 1 is a diagram of a memory, in accordance with one or more embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The memory circuits discussed herein are configured to provide power management through bit line (BL) sleep or a partial BL sleep. Powering up the entire memory array at the same time results in long wakeup times and large wakeup currents. Sequential word line based wakeup methods are sometimes implemented in an attempt to mitigate the large wakeup currents that occur when the large portions of the memory are powered up at the same time. However, sequential wakeup methods increase a physical size of a memory and have leakage current issues. Partial BL sleep circuits, in some embodiments, provide better power saving efficiency and lower area cost as compared to row-based word line (WL) sleep designs, and allow sequential wakeup of memory cells to mitigate large wakeup currents. Partial BL sleep circuits, in some embodiments, further provide fast wakeup times compared with macro-based designs in some other applications. Partial BL sleep circuits, in some embodiments, are transparent to users and are free from any special timing protocols.

FIG. 1 is a diagram of a memory 100, in accordance with one or more embodiments. Memory 100 is an SRAM circuit configured for partial bit line (BL) (or column-based) floating sleep power management, which floats (i.e., electrically decouples) sets of bit lines BL and precharges other sets of bit lines BL. Memory 100 comprises a memory cell block (MCB) 101 having a plurality of memory cells MC. Memory cells MC are addressable via data lines such as N bit line pairs BL/BLB and M word lines WL. The bit line pairs BL/BLB each comprise a bit line BL and a complementary bit line BLB. A control circuit (CNT) 111 is configured to generate one or more signals to select a word line WL, such as word line 107, and a bit line pair BL/BLB, such as bit line pair 105, to access a specific memory cell 103 for read and/or write operations.

In some embodiments, when memory 100 is not being accessed, the memory cells MC are placed into a sleep mode to reduce power consumption while maintaining the contents therein. In the sleep mode, in some embodiments, the bit lines BL and/or complementary bit lines BLB are set to be in a floating state (i.e., not electrically coupled to a fixed node) while the memory cells MC are supplied with a retention voltage to remain in their previous state. However, the memory cells MC must transition from the sleep mode to an active mode when the memory 100 is subsequently accessed.

The memory includes P input/output (I/O) control circuits 113[1]~113[P] (collectively referred to as control circuits 113) that are coupled with sets of bit line pairs BL/BLB. Each I/O control circuit 113 comprises a logic gate 115, an inverter 117, and a plurality of charging circuits 125 associated with the sets of bit line pairs BL/BLB. The logic gate 115 of each I/O control circuit 113 is coupled with the control line 119 via a respective inverter 117. Each I/O control circuit 113 is also coupled with one or more of a first select line 121 or a second select line 123 via the respective logic gate 115. In the embodiment depicted in FIG. 1, the logic gates 115 are NAND gates. In I/O control circuit 113[1], logic gate 115 is a NAND gate having a first input terminal, a second input terminal, and an output terminal. Inverter 117 has an input terminal coupled with control line 119 and an output terminal coupled with the first input terminal of logic gate 115. The second input terminal of logic gate 115 is coupled with second select line 123. In some embodiments, a portion of the P input/output (I/O) control circuits 113 have the second input terminals of the corresponding logic gates 115 coupled with first select line 121 and a remaining portion of the P input/output (I/O) control circuits 113 have the second input terminals of the corresponding logic gates 115 coupled with second select line 123. The output terminal of logic gate 115 is coupled with charging circuits 125 corresponding to the sets of bit line pairs BL/BLB associated with I/O control circuit 113[1]. Other I/O control circuits 113[2]~113[P] have configurations similar to the configuration of I/O control circuit 113[1], and detailed description thereof is thus omitted. In some embodiments, the I/O control circuits 113 are implemented by a suitable circuit to perform the operations described below.

The I/O control circuits 113 are configured to control a set of the bit line pairs BL/BLB based on a bit line control signal BLCS received via the control line 119, and signal(s) received by way of the first select line 121 and/or the second select line 123. The control circuit 111 is configured to generate the bit line control signal BLCS, a first bit line select signal BLSS1 and a second bit line select signal BLSS2. The control line 119 is configured to carry the bit line control signal BLCS. The first select line 121 is configured to carry the first bit line select signal BLSS1. The second select line 123 is configured to carry the second bit line select signal BLSS2.

Charging circuit 125 is configured to electrically couple the bit lines BL or the complementary bit lines BLB with a pre-charge voltage, such as voltage VDD, or to electrically decouple the bit lines BL or the complementary bit lines BLB from the precharge voltage. The I/O control circuits 113 and corresponding charging circuits 125 are configured to cause one or more of the bit lines BL or the complementary bit lines BLB to be in one or more of an accessed state, a floating state, and/or a precharge state. In some embodiments, when the memory is in the sleep mode, the bit line pairs BL/BLB are in the floating state (i.e., not electrically coupled to a fixed node) by decoupling the bit line pairs BL/BLB from the precharge voltage. In some embodiments, when the bit line pairs BL/BLB are set in the floating state, bit line pairs BL/BLB are affected by various leakage paths, and the voltage levels on the bit line pairs BL/BLB are thus unknown. In some embodiments, during the sleep mode, the bit line pairs BL/BLB are in the precharge state (i.e., electrically coupled to a predetermined voltage VDD) by coupling the bit line pairs BL/BLB to the precharge voltage VDD. In some embodiments, when the memory is in the active mode, the bit line pairs BL/BLB are either set at the precharge state or are set at the accessed state. The bit line pairs BL/BLB are in the accessed state when bit line pairs BL/BLB are electrically decoupled from the precharge voltage but are not deemed "floating," because the bit line pairs BL/BLB, if selected to be accessed, are coupled with a corresponding sense amplifier or a write driver.

To change the state of a bit line BL or a complementary bit line BLB, each I/O control circuit 113 is configured to compare a logic state of the bit line control signal BLCS with a logic state of the first bit line select signal BLSS1 or the second bit line select signal BLSS2. Using the comparison result, the charging circuit 125 is configured to selectively couple the predefined voltage VDD to the corresponding bit lines BL and/or the complementary bit lines BLB and enter the precharge state. In the embodiment depicted in FIG. 1, each charging circuit 125 includes two P-type transistors. Sources of the two P-type transistors are configured to receive the predefined voltage VDD. A drain of one of the two P-type transistors is coupled with bit line BL; and a drain of the other one of the two P-type transistors is coupled with complementary bit line BLB. Gates of the two P-type transistors are coupled with the output terminal of logic gate 115.

In operation, in some embodiments, if the bit line control signal BLCS is set by the controller 111 to be at a logic "low" and the corresponding one of the first bit line select signal BLSS1 or the second bit line select signal BLSS2 is set by the control circuit 111 to be at a logic "high," then the I/O control circuit 113 outputs a logic "low" to turn the transistor pair of charging circuit 125 on. When the transistor pair of charging circuit 125 is on, the bit line pairs BL/BLB are coupled with the predefined voltage VDD and deemed to be in the precharge state. That is, when the transistor pair of charging circuit 125 is turned on, the bit line pairs BL/BLB carry the predefined voltage VDD associated with the precharge state.

Moreover, when the corresponding one of the first bit line select signal BLSS1 or the second bit line select signal BLSS2 is set by the control circuit 111 to be at a logic "high," and the bit line control signal BLCS is set by the controller 111 to be at a logic "high," the I/O control circuit 113 is configured to turn the transistors of charging circuit 125 off. Under this scenario, the bit line pairs BL/BLB are decoupled from the predefined voltage VDD but, if selected to be accessed, are controlled by the corresponding sense amplifier or write driver, and the bit line pairs BL/BLB are deemed to be in the accessed state.

If the bit line control signal BLCS is at a logic "high," then the I/O control circuit 113 is configured to turn the transistors of charging circuit 125 off. When the transistors of charging circuit 125 are off, the bit line pairs BL/BLB are not coupled with the predefined voltage VDD nor controlled by the corresponding sense amplifier or write driver, and are thus deemed to be in the floating state. In some embodiments, other suitable combinations of signals and/or logic states are usable to cause one or more sets of bit lines BL and complementary bit lines BLB to be in a floating state, an accessed state, and/or a precharge state.

The bit line control signal BLCS is based on a chip enable signal (CEB) that enables the memory. The I/O control circuits 113 are configured to maintain the associated bit line pairs BL/BLB in the precharge state if the chip select signal CEB is at a logic "high" (e.g., CEB=H). In some embodiments, if the chip select signal CEB is at a logic "high," whether a bit line BL or a complementary bit line BLB is to be in the precharge state or in the floating state is determined by the corresponding bit line select signals BLSS1 or BLSS2.

In some embodiments, as a quantity of I/O control circuits 113 that are inactive increases, an amount of leakage current that is saved by the memory 100 also increases. The first bit line select signal BLSS1 and the second bit line select signal BLSS2 control the quantity of bit line pairs BL/BLB placed in the floating state during low-power operations. By controlling the quantity of bit line pairs BL/BLB in the floating state, the control circuit 111 thereby controls the wakeup time and a wakeup current draw of the memory 100 when transitioning from a sleep mode to the active mode. As the quantity of bit line pairs BL/BLB maintained at a predefined voltage (i.e., in the precharge state) increases, the amount of wakeup current needed to transition the memory 100 from a sleep mode to the active mode decreases.

Control circuit 111 is configured to receive input signals and to generate signals to control the I/O control circuits 113. In some embodiments, the control circuit 111 generates the bit line control signal BLCS, the first bit line select signal BLSS1 and the second bit line select signal BLSS2. The logic states of the bit line control signal BLCS, the first bit line select signal BLSS1 and the second bit line select signal BLSS2 are determined by the control circuit 111 based on the one or more input signals. In some embodiments, the input signals are a shutdown signal SD and a deep sleep signal DSLP.

The control circuit 111 receives the chip enable signal CEB to control the I/O control circuits 113. In other examples, the control circuit 111 may receive other signals to control the I/O control circuits 113. The control circuit 111 causes the I/O control circuits 113 to be coupled with the first select line 121 to maintain the associated bit line pairs BL/BLB in the precharge state. The remaining I/O control circuits 113 that are coupled to the second select line 123 maintain the corresponding bit line pairs BL/BLB in the floating state. Accordingly, when the memory 100 is transitioned from the sleep mode to an active mode, a wakeup current is generated only in the I/O control circuits 113 that are in the floating state, thereby reducing the wakeup current and the wakeup time.

In some embodiments, memory 100 uses the chip enable signal CEB to provide a transparent control scheme to users, and to eliminate the need for special timing protocols for SRAM wakeup. The memory 100 is configured to maintain a set of bit line pairs BL/BLB at a predefined voltage. The number of bit line pairs maintained at the predefined voltage reduces the wakeup current generated by the memory 100 during a transition from the sleep mode to an active mode. Because the wakeup current is reduced, the memory 100 is capable of activating all of the bit line pairs BL/BLB without risking damage to a power mesh layer (not shown), which is a set of lines that provides power to the various components of the memory 100.

In some embodiments, the number of bit line pairs BL/BLB set at the precharge state and the number of bit line pairs set at the floating state when the memory is at sleep mode is determined by the placement of via plugs between various logic gates 115 and select lines 121 and 123. In some embodiments, during the fabrication process of the memory in accordance with the present disclosure, a change of design with regard to the number of bit line pairs to be set at the precharge state or floating state is executed by only replacing the masks corresponding to the related via plugs.

Figure 2:
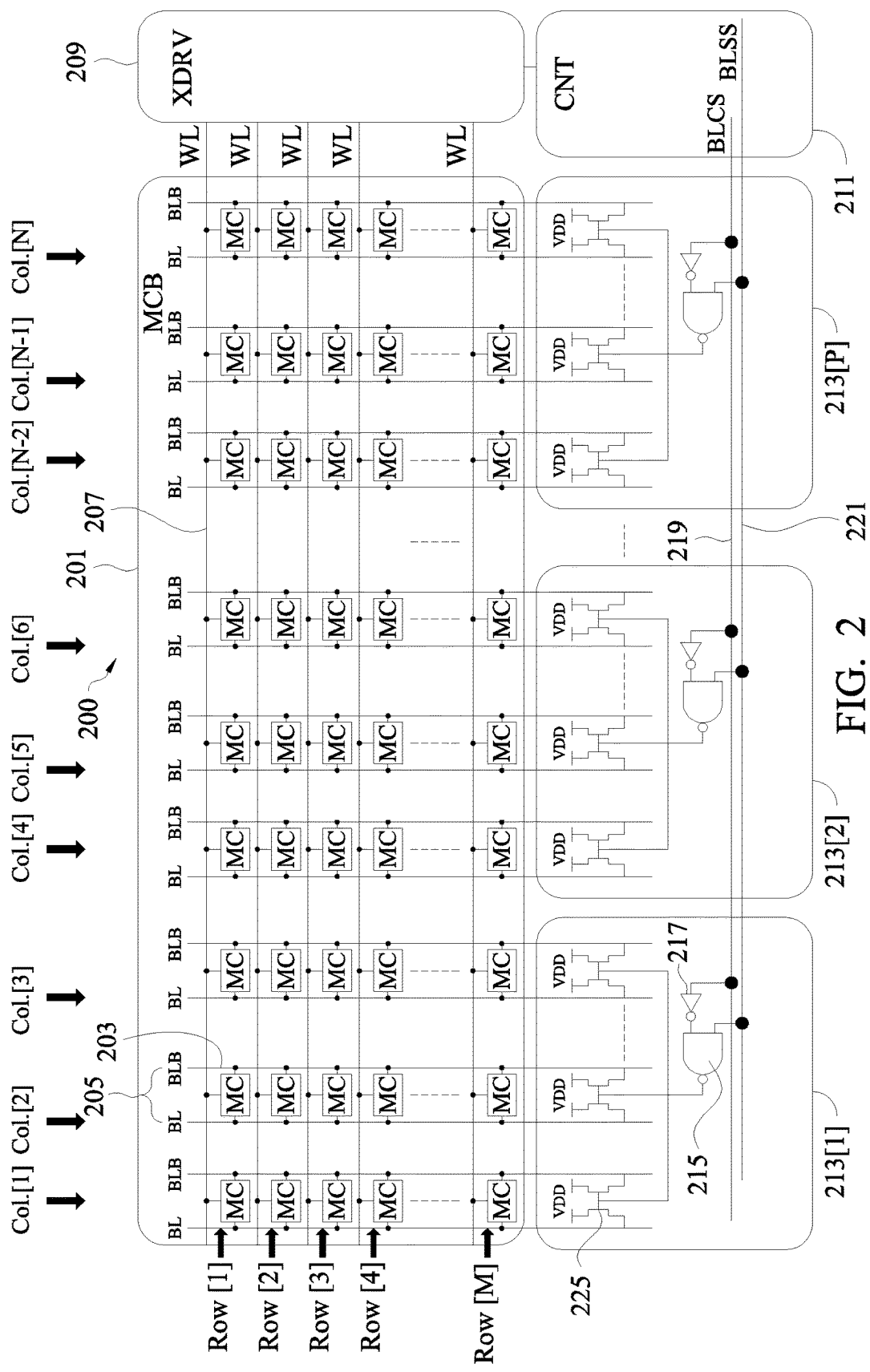
FIG. 2 is a diagram of a memory having a single select line, in accordance with one or more embodiments.

FIG. 2 is a diagram of a memory 200 having a single select line 221, in accordance with one or more embodiments. Components in FIG. 2 that are the same or similar to those in FIG. 1 are given the same reference labels or given the reference numerals increased by 100. Detailed description thereof is thus omitted.

Compared with memory 100, in memory 200, all of the bit line pairs BL/BLB are controlled based on the bit line select signal BLSS instead of different select signals BLSS1 and BLSS2 in FIG. 1. For example, all of the bit line pairs BL/BLB are set to be in the floating state, the accessed state, or the precharge state based on the logic conditions of the bit line control signal BLCS and the bit line select signal BLSS. By placing all of the bit line pairs BL/BLB in the floating state, the memory 200 decreases an amount of leakage current during the sleep mode as compared to memory 100. Compared with memory 100, memory 200 consumes a larger wakeup current. To avoid damage to the power mesh layer (not shown), memory 200 is capable of being sequentially controlled during wakeup by adjusting a parasitic resistance-capacitance (RC) delay of select line 221.

In some embodiments, if the bit line select signal BLSS is at a logic "low," the signal output by the logic gates 215 is at a logic high. The high logic level signal output by the logic gates 215 prevents the transistors of precharge circuits 225 from supplying a predefined voltage VDD to the bit line pairs BL/BLB (i.e., setting bit line pairs BL/BLB at the floating state). If the bit line control signal is at a logic "low" and the bit line select signal is at a logic "high," then the signal output by the logic gates 215 transitions to a logic "low." The low logic level signal output by the logic gates 215 causes the transistors of precharge circuits 225 to turn on to couple the predefined voltage VDD to the bit line pairs BL/BLB (i.e., setting bit line pairs BL/BLB at the precharge state). Furthermore, in some embodiments, if the bit line control signal BLCS is at a logic "high" and the bit line select signal BLSS is at a logic "high," then the signal output by the logic gates 215 is at a logic high. The high logic level signal output by the logic gates 215 prevents the transistors of precharge circuits 225 from supplying a predefined voltage VDD to the bit line pairs BL/BLB (i.e., setting bit line pairs BL/BLB at the accessed state). In some embodiments, memory 200 is configured to activate each I/O control circuit 213 sequentially to prevent generation of large wakeup currents that could damage the power mesh layer of memory 200. In such an embodiment, the I/O circuits 213 include a delay circuit to delay activation of the precharge circuits 225, thereby allowing the I/O control circuits 213 to precharge in a sequence to reduce current transients (i.e., current spikes).

Figure 3:
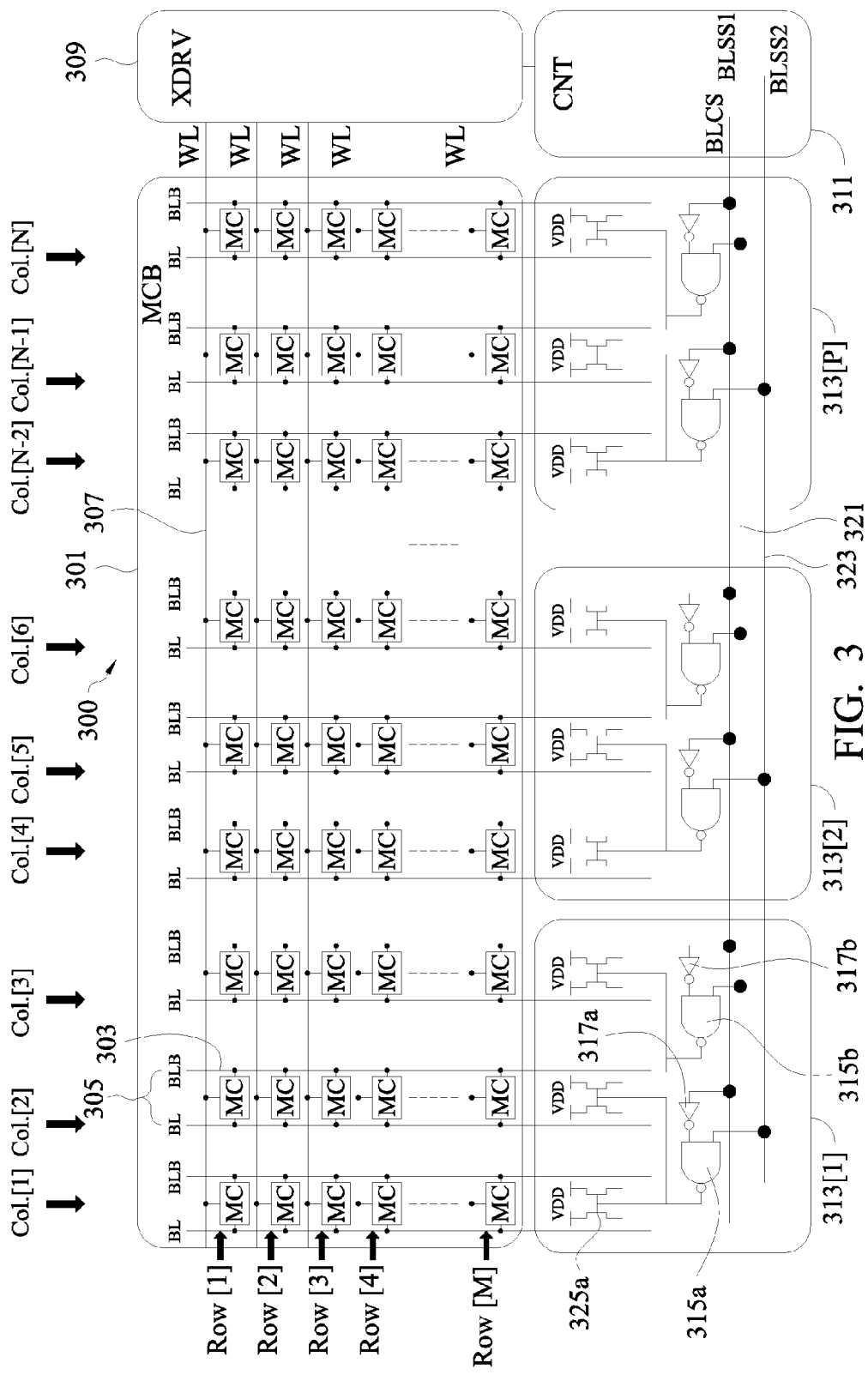
FIG. 3 is a diagram of a memory having I/O control circuits that include at least two logic gates, in accordance with one or more embodiments.

FIG. 3 is a diagram of a memory 300 having I/O control circuits 313 that include at least two logic gates 315, in accordance with one or more embodiments. Components in FIG. 3 that are the same or similar to those in FIG. 1 are given the same reference labels or given the reference numerals increased by 200. Detailed description thereof is thus omitted.

Memory 300 is configured for partial bit line control, meaning that the I/O control circuits 313 are configured to precharge different bit line pairs BL/BLB associated with an individual I/O control circuit 313[1], 313[2], . . . , or 313[N]. In memory 300, the I/O control circuits 313 comprise multiple logic gates (collectively referred to as logic gates 315) to enable selective precharging of different bit line pairs BL/BLB. For example, I/O control circuit 313[1] comprises two logic gates 315a and 315b that are each coupled to a different bit line pair BL/BLB associated with I/O control circuit 313[1]. Memory 300 includes first select line 321 and second select line 323. One logic gate 315b is coupled with first select line 321 and the other logic gate 315a is coupled with second select line 323.

In memory 300, control circuit 311 generates first bit line select signal BLSS1 and second bit line select signal BLSS2. In some embodiments, if the controller 311 generates a bit line control signal BLCS that is at a logic "low," and the first bit line select signal BLSS1 is a logic "high," then the bit line pair BL/BLB coupled with the charging circuits controlled by the output signal of logic gate 315b is placed in the precharge floating state. If the controller 311 generates a second bit line select signal BLSS2 that is a logic "low," the bit line pair BL/BLB coupled with the charging circuits controlled by the output signal of logic gate 315a is placed in the floating state.

Other I/O control circuits 313[2]~313[P] have configurations similar to the configuration of I/O control circuit 313[1], and detailed description thereof is thus omitted.

Including multiple logic gates 315 in an I/O control circuit 313 allows some of the bit line pairs BL/BLB to be placed in the precharge state while other bit line pairs BL/BLB are caused to be in the floating state. In some embodiments, all of the bit line pairs BL/BLB coupled with the I/O control circuits 313 are caused to be in the floating state, the accessed state, or the precharge state simultaneously and/or sequentially, based on a logic condition combination of the bit line control signal BLCS, the first bit line select signal BLSS1 and the second bit line select signal BLSS2.

In some embodiments, memory 300 is configured to be coupled with a multiplexer design that includes memory cell columns capable of being in the sleep mode or the active mode. Multiple bit line pairs BL/BLB are capable of being controlled based on the bit line control signal BLCS, the first bit line select signal BLSS1, the second bit line select signal BLSS2, and/or one or more other bit line select signals BLSSX (not shown). For example, if the memory 300 is configured to include additional select lines (not shown), in some embodiments, then the I/O control circuits 313 are configured to include additional logic gates 315 to selectively control the bit line pairs BL/BLB that are coupled with the I/O control circuits 313. The selective maintenance of at least some of the bit line pairs BL/BLB in the precharge state reduces the time taken to wake up the memory 300 from the sleep mode.

Figure 4:
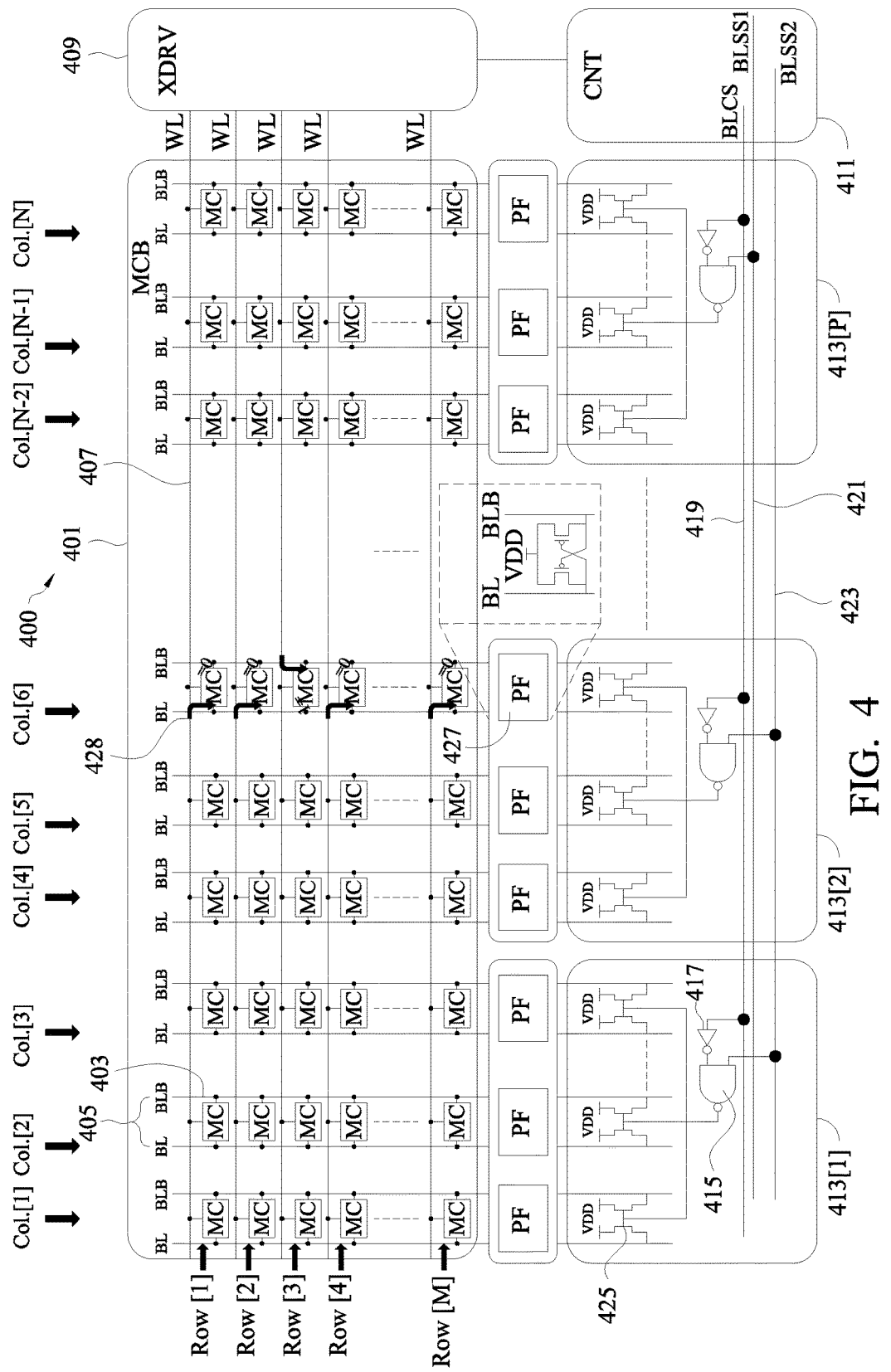
FIG. 4 is a diagram of a memory having positive feedback circuits, in accordance with one or more embodiments.

FIG. 4 is a diagram of a memory 400 having a plurality of positive feedback circuits PF, in accordance with one or more embodiments. Components in FIG. 4 that are the same or similar to those in FIG. 1 are given the same reference labels or given the reference numerals increased by 300. Detailed description thereof is thus omitted.

Each positive feedback circuit PF is coupled between a bit line pair BL/BLB and a corresponding I/O control circuit 413. When the bit line control signal BLCS and bit line select signals BLSS1/BLSS2 enable the I/O control circuit 413, the positive feedback circuits PF are configured to selectively cause one of the bit line BL or the complementary bit line BLB of a bit line pair to carry the predefined voltage VDD based on a leakage current. In some examples, the leakage current activates a component of one of the positive feedback circuit PF.

Figure 7:
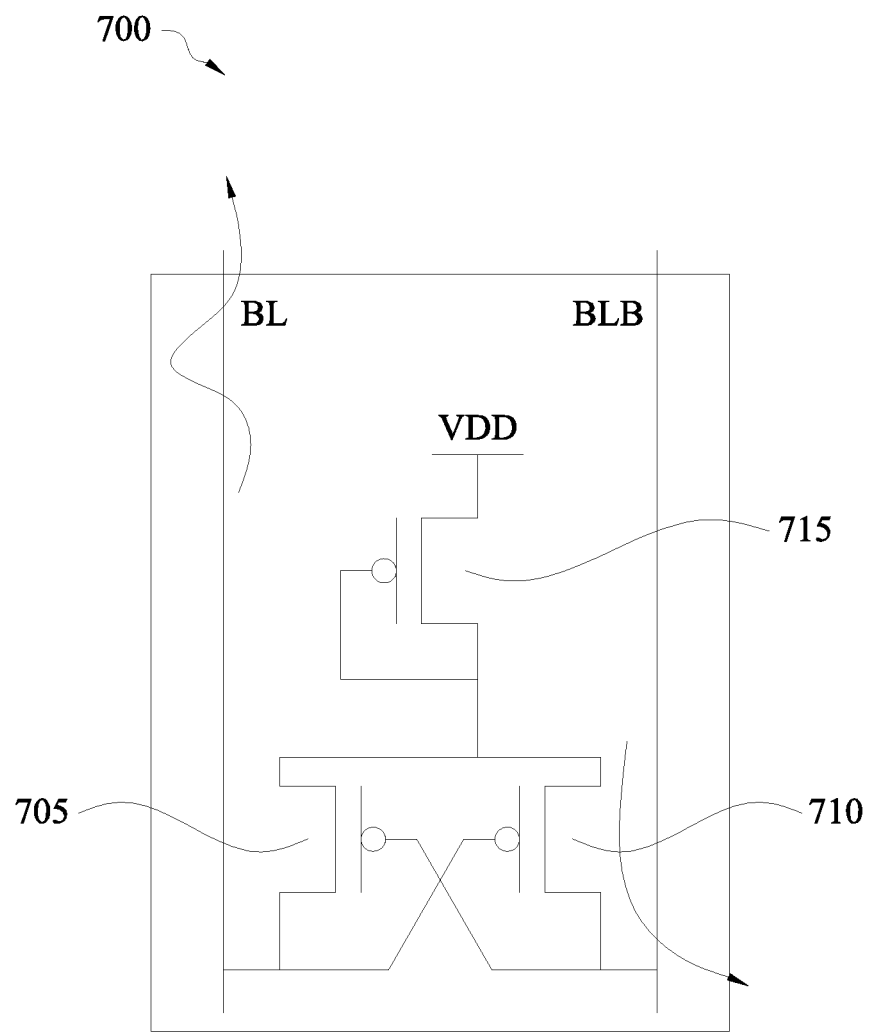
FIG. 7 is diagram of a positive feedback circuit usable in a memory of FIG. 4-6, in accordance with one or more embodiments.
Figure 8:
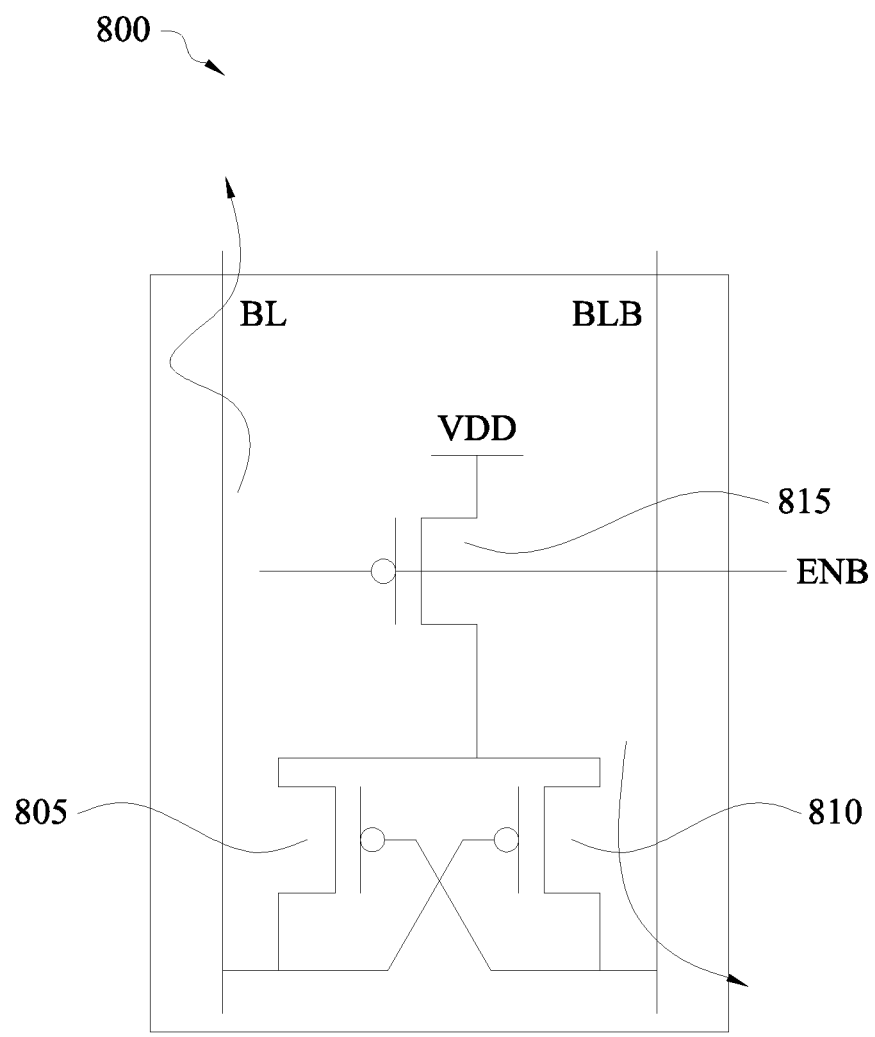
FIG. 8 is a diagram of a positive feedback circuit usable in a memory of FIG. 4-6, in accordance with one or more embodiments.

An example positive feedback circuit 427 of the positive feedback circuits PF is illustrated in detail in conjunction with memory cells MC and bit line pairs BL/BLB of column Col.[6]. The other positive feedback circuits PF in the other columns have configurations similar to positive feedback circuit 427 and detailed description thereof is thus omitted. Positive feedback circuit 427 includes two cross-coupled P-type transistors that are configured to cause one of the bit line BL or the complementary bit line BLB of the bit line pair to be precharged to voltage VDD and the other one from being coupled with voltage VDD through positive feedback circuit 427. Other implementations of the positive feedback circuit PF will be further illustrated in conjunction with FIG. 7 and FIG. 8. In some embodiments as illustrated in FIG. 7, a positive feedback circuit PF further includes a diode coupled with the pair of cross coupled transistors. In some embodiments as illustrated in FIG. 8, a positive feedback circuit PF further includes a switch coupled with the pair of cross coupled transistors.

In some embodiments, positive feedback circuit 427 is configured to cause a leakage path 428 to be turned off based on a content of the memory cells MC in column Col.[6]. For example, if memory cells MC in column Col.[6] are configured to store binary values 0, 0, 1, 0, and 0, the bit line BL of the bit line pair in column Col.[6] will exhibit more leakage than the complementary bit line BLB. In this example, the positive feedback circuit 427 in column Col.[6] is configured to precharge the complementary bit line BLB. In some embodiments, the positive feedback circuits PF is also used as a recovery circuit, a part of a sense amplifier, or a part of a write driver for the bit line BL or the complementary bit line BLB during read/write operations to a memory cell MC of column Col.[6].

Figure 5:
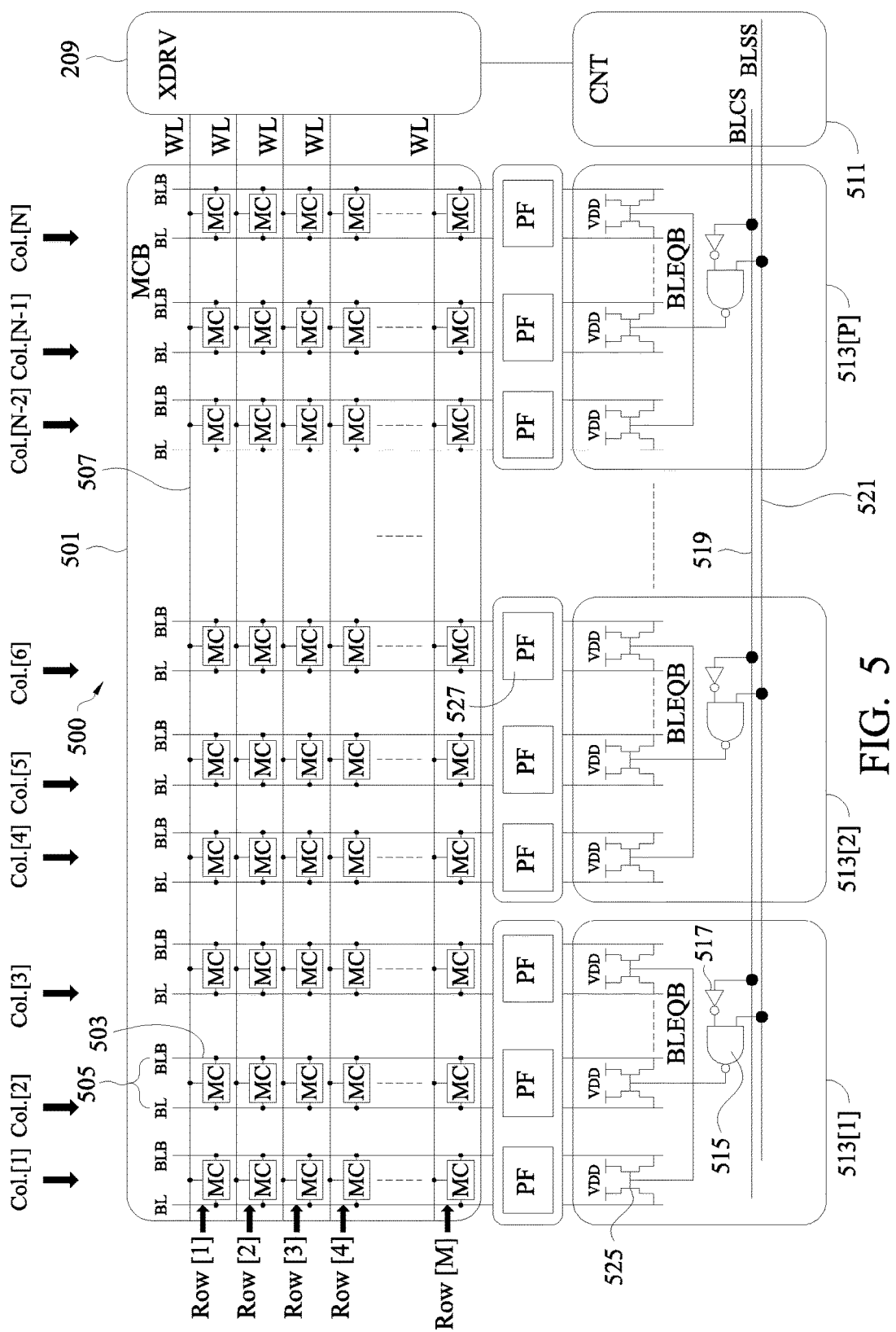
FIG. 5 is a diagram of a memory having positive feedback circuits, in accordance with one or more embodiments.

FIG. 5 is a diagram of a memory 500 having a plurality of positive feedback circuits PF, in accordance with one or more embodiments. Components in FIG. 5 that are the same or similar to those in FIG. 2 are given the same reference labels or given the reference numerals increased by 300. Positive feedback circuits PF in FIG. 5 have features similar to those discussed with respect to positive feedback circuits PF in FIG. 4. Detailed description thereof is thus omitted. Compared with memory 400, in memory 500, all of the bit line pairs BL/BLB are controlled based on the bit line select signal BLSS instead of different select signals BLSS1 and BLSS2 in a manner similar to those advanced above with respect to FIG. 2.

Figure 6:
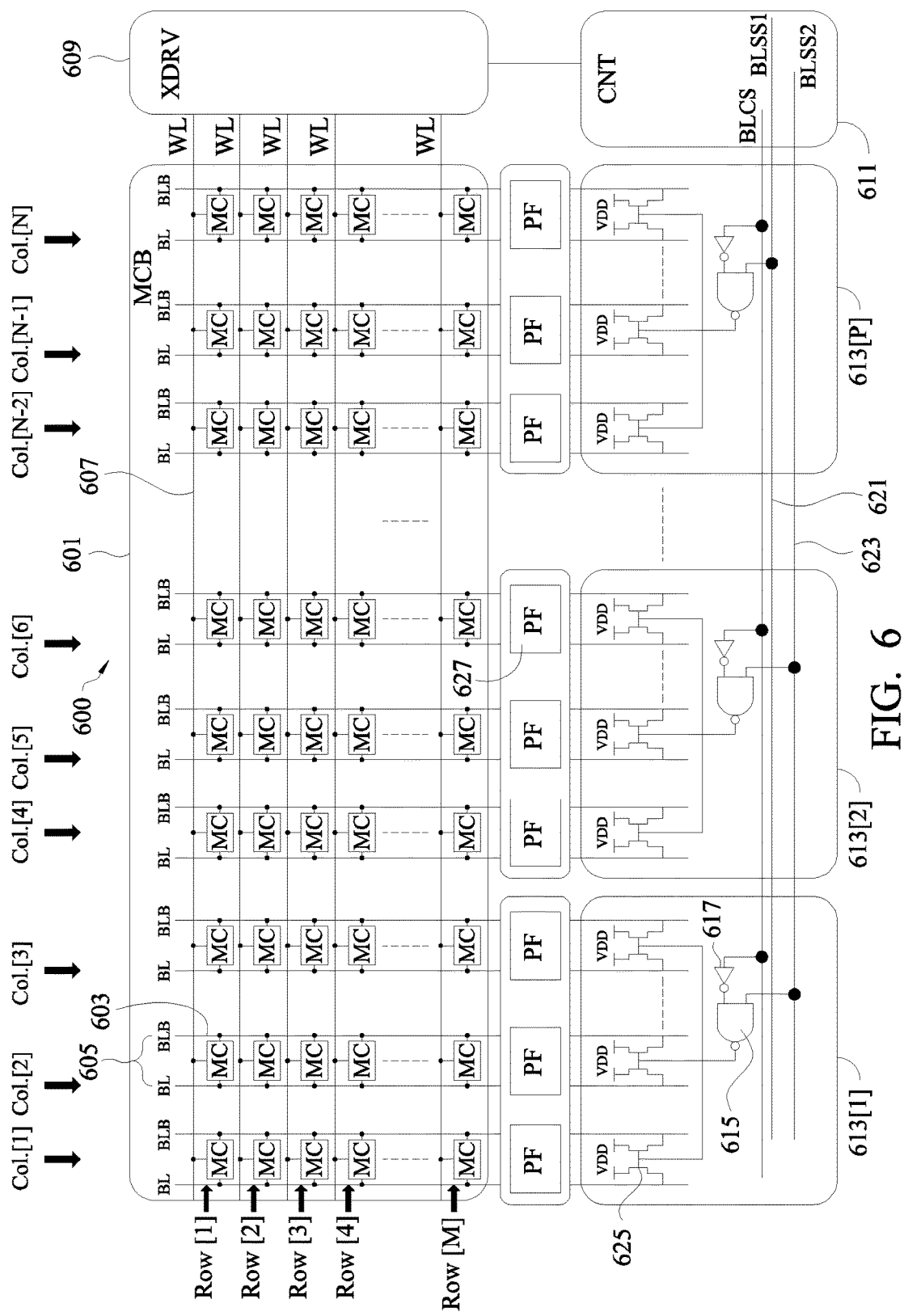
FIG. 6 is a diagram of a memory having positive feedback circuits, in accordance with one or more embodiments

FIG. 6 is a diagram of a memory 600 having a plurality of positive feedback circuits PF, in accordance with one or more embodiments. Components in FIG. 6 that are the same or similar to those in FIG. 3 are given the same reference labels or given the reference numerals increased by 300. Positive feedback circuits PF in FIG. 6 have features similar to those discussed with respect to positive feedback circuits PF in FIG. 4. Detailed description thereof is thus omitted. Compared with memory 400, in memory 600, the bit line pairs BL/BLB in an I/O control circuit 613 are divided into various groups each controlled based on a corresponding one of select signals BLSS1 and BLSS2 in a manner similar to those advanced above with respect to FIG. 3.

FIG. 7 is diagram of a positive feedback circuit 700, in accordance with one or more embodiments. Positive feedback circuit 700 is usable in place of one or more of positive feedback circuits PF in FIG. 4, FIG. 5, or FIG. 6. Positive feedback circuit 700 comprises a first transistor 705 cross coupled with a second transistor 710. The first transistor 705 and the second transistor 710 are coupled with a bit line BL and a complementary bit line BLB. Positive feedback circuit 700 further comprises a diode-connected transistor 715 coupled with the first transistor 705 and the second transistor 710.

First transistor 705 is a PMOS transistor and second transistor 710 is a PMOS transistor. First transistor 705 controls whether the bit line BL is in the precharge state and the second transistor 710 controls whether the complementary bit line BLB is in the precharge state.

In the positive feedback circuit 700, the first transistor 705 and second transistor 710 have mutually exclusive states. That is, when the first transistor 705 is turned on to provide the predefined voltage to the bit line BL, the second transistor is turned off or biased at a high-resistance state to place the complementary bit line BLB in the floating state, and vice versa. The configuration of the positive feedback circuit 700 precharges the bit line that would be associated with the largest leakage current, thereby preventing leakage current from that bit line. A circuit that includes the positive feedback circuit 700 has a smaller leakage current compared to a circuit in which the bit line BL and the complementary bit line BLB are both placed in the precharge state or the floating state.

Diode-connected transistor 715 is configured to provide a predetermined voltage drop between source and drain of diode-connected transistor 715. In some embodiments, when a corresponding transistor 705 or 710 is turned on to electrically couple bit line BL or complementary bit line BLB with voltage VDD, the precharged bit line BL or precharged complementary bit line BLB is charged to a voltage level that is below the voltage level of voltage VDD by the predetermined voltage drop of diode-connected transistor 715. By having a lower voltage level on the precharged bit line BL or BLB, a leakage current associated with the precharged bit line BL or BLB is further reduced.

FIG. 8 is a diagram of another positive feedback circuit 800, in accordance with one or more embodiments. Positive feedback circuit 800 is usable in place of one or more of positive feedback circuits PF in FIG. 4, FIG. 5, or FIG. 6. Positive feedback circuit 800 comprises a first transistor 805 cross coupled with a second transistor 810. The first transistor 805 and the second transistor 810 are coupled with a bit line BL and a complementary bit line BLB. Positive feedback circuit 800 further comprises a switch 815 coupled with the first transistor 805 and the second transistor 810.

First transistor 805 is a PMOS transistor and second transistor 810 is a PMOS transistor. First transistor 805 controls whether the bit line BL is in the precharge state and the second transistor 810 controls whether the complementary bit line BLB is in the precharge state.

In the positive feedback circuit 800, the bit line pair coupled with the positive feedback circuit 800 causes the first transistor 805 and second transistor 810 to have mutually exclusive states as described above with reference to FIG. 7. A circuit that includes the positive feedback circuit 800 has a smaller leakage current compared to a circuit in which the bit line BL and the complementary bit line BLB are both placed in the floating state.

Switch 815 is configured to electrically couple transistors 805 and 810 with voltage VDD responsive to an enable signal ENB. In some embodiments, switch 833 is a P-type transistor. When enable signal ENB is logically "low," switch 833 functions as a short circuit and transistors 805 and 810 are coupled with voltage VDD through switch 815. As such, positive feedback circuit 800 is enabled. When enable signal ENB is logically "high," switch 815 functions as an open circuit and transistors 805 and 810 are not electrically coupled with voltage VDD through switch 815. As such, positive feedback circuit 800 is disabled.

Figure 9:
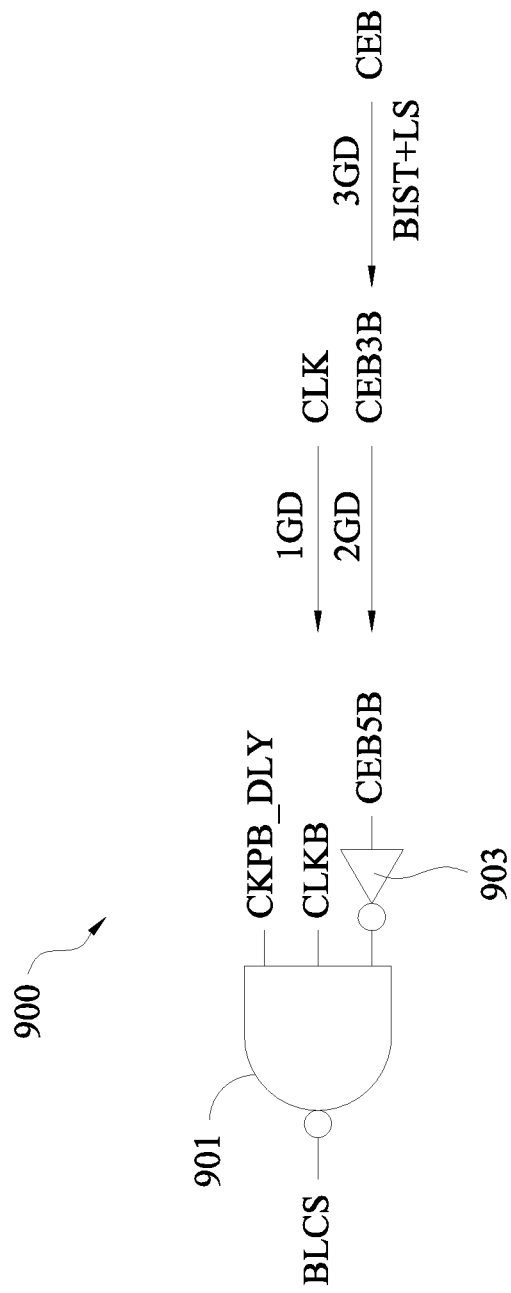
FIG. 9 is a diagram of a portion of a control circuit usable in a memory of FIG. 1-6, in accordance with one or more embodiments.

FIG. 9 is a diagram of a signal generator circuit 900, in accordance with one or more embodiments. The signal generator circuit 900 is usable as a portion of control circuit 111, 211, 311, 411, 511, or 611. Signal generator circuit 900 includes a NAND logic gate 901 and an inverter 903 coupled with the logic NAND gate 901. Signal generator circuit 900 is configured to receive a delay signal CKPB_DLY, a clock signal CLKB and the chip enable signal CEB. The signal generator circuit 900 is configured to receive the chip enable signal CEB by way of the inverter 903. The signal generator circuit 900 is configured to output the bit line control signal BLCS based on the received delay signal CKPB_DLY, clock signal CLKB, and the chip enable signal CEB.

Figure 10:
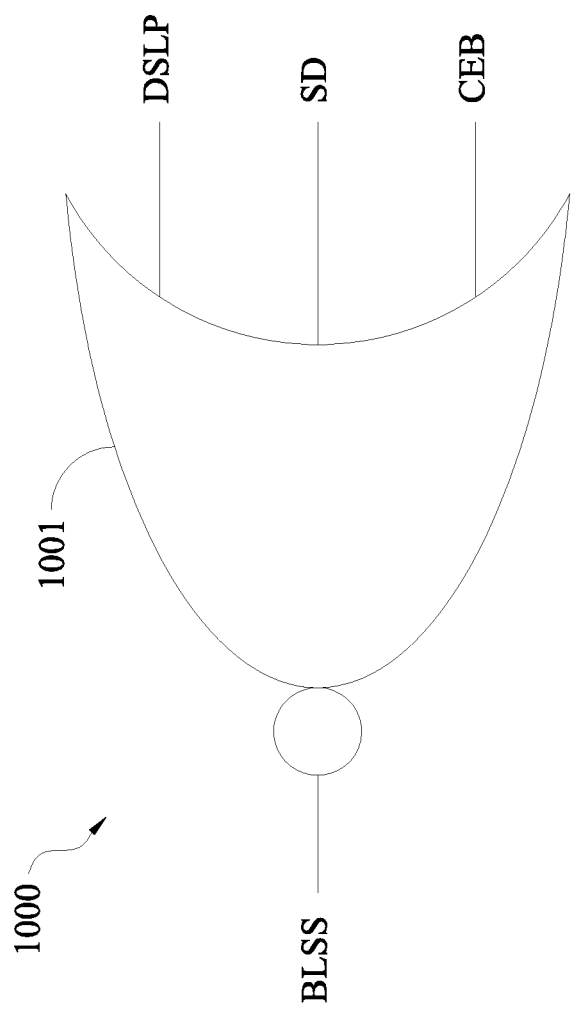
FIG. 10 is a diagram of a portion of a control circuit usable in a memory of FIG. 4-6, in accordance with one or more embodiments.

FIG. 10 is a diagram of a signal generator circuit 1000, in accordance with one or more embodiments. The signal generator circuit 1000 is usable as a portion of control circuit 111, 211, 311, 411, 511, or 611. The signal generator circuit 1000 includes a logic NOR gate 1001. In this example, the signal generator circuit 1000 is configured to receive a deep sleep signal DSLP, a shutdown signal SD and the chip enable signal CEB. The input circuit 1000 is configured to output a bit line select signal BLSS based on the received deep sleep signal DSLP, shutdown signal SD or chip enable signal CEB.

Figure 11:
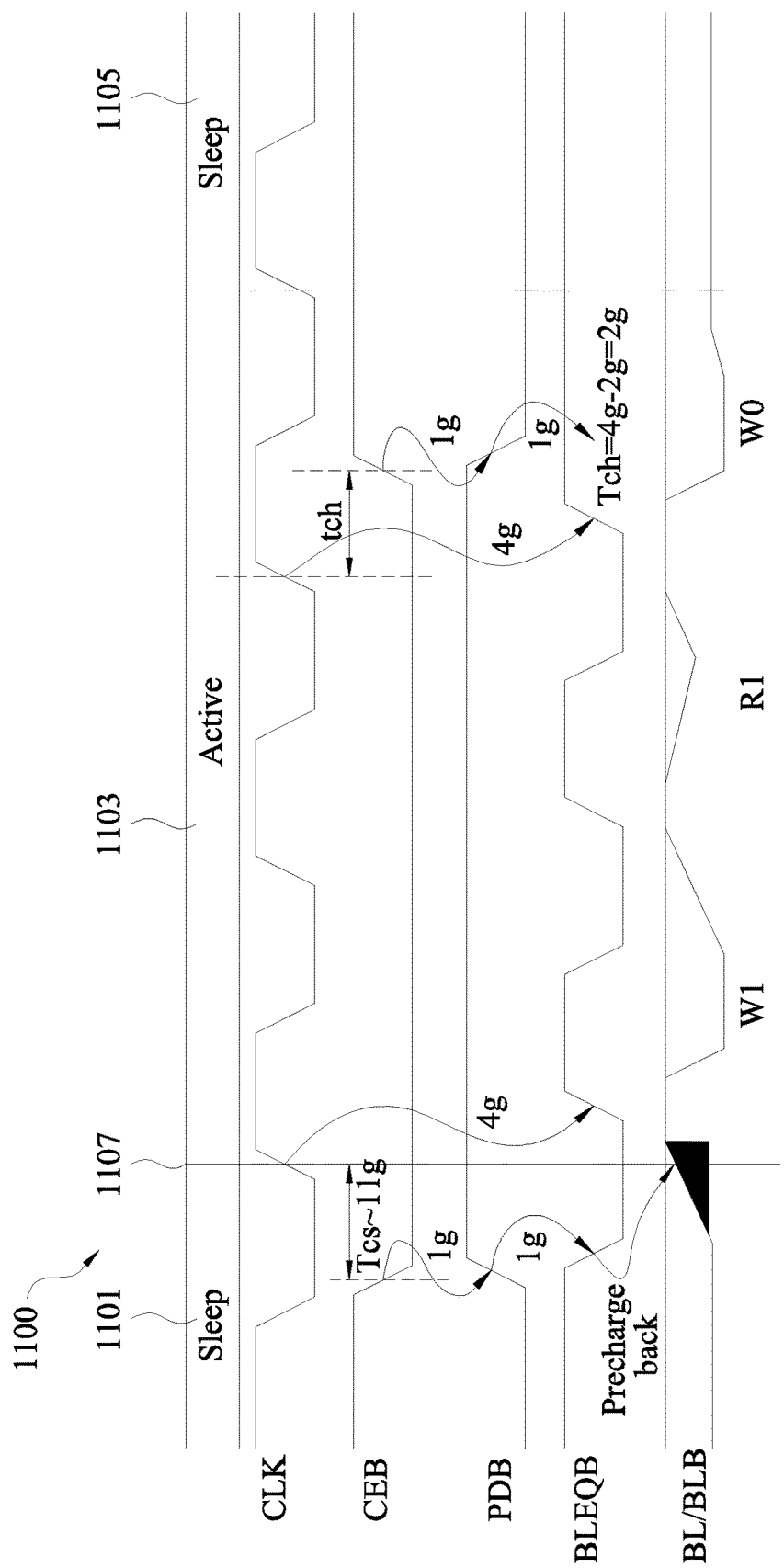
FIG. 11 is a timing diagram illustrating the status of various signals in the control circuit of FIG. 9 and a bit line pair in a memory of FIG. 1-6, in accordance with one or more embodiments.

FIG. 11 is a timing diagram 1100 of the status of a bit line pair BL/BLB, such as bit line pair 405 in FIG. 4, in accordance with one or more embodiments. The timing diagram is a graph of the logic conditions of the clock signal CLK, the chip enable signal CEB, a power down signal PDB, a bit line select signal BLEQB, the bit line BL, and the complementary bit line BLB. Clock signal CLK oscillates during a first sleep period 1101, during an active period 1103, and during a second sleep period 1105. The chip enable signal CEB is either at a logic "high" or a logic "low." The bit line select signal BLEQB is either at a logic "high" or a logic "low." The bit line BL and the complementary bit line BLB is at a logic "high," a logic "low," or a "floating state."

In the first sleep period 1101, the chip enable signal CEB goes "low" to indicate a transition to the active period 1103. As a result, during the first sleep period 1101, the power down signal PDB goes "high" and then a bit line select signal BLEQB transitions to a "low," thereby setting the bit line BL to the precharge state. At time 1107, the first sleep period 1101 transitions to the active period 1103. In the active period 1103, various read R1 and/or write W1/W0 operations are performed in the memory cells MC.

During the active period 1103, the chip enable signal CEB transitions from "low" to "high" to indicate a transition to the second sleep period 1105. When the chip enable signal CEB goes "high," the bit line select signal BLEQB remains in a "high" state during the second sleep period 1105. That is, the bit line select signal BLEQB is generally in a "high" state unless the chip enable signal CEB is a "low." By causing the bit line BL or the complementary bit line BLB to be in the precharge state or the floating state based on a content of the memory cells MC and a leakage path in the memory, the leakage current in the memory is reduced. Additionally, the positive feedback circuits PF reduce stressing that might occur in the memory caused by transitioning the memory between a sleep mode and an active mode. Further, the operation of the positive feedback circuits PF makes it possible to reduce the leakage current in a memory without adding an additional power line, for example, which reduces the physical size of the memory and reduces the complexity of the memory.

Figure 12:
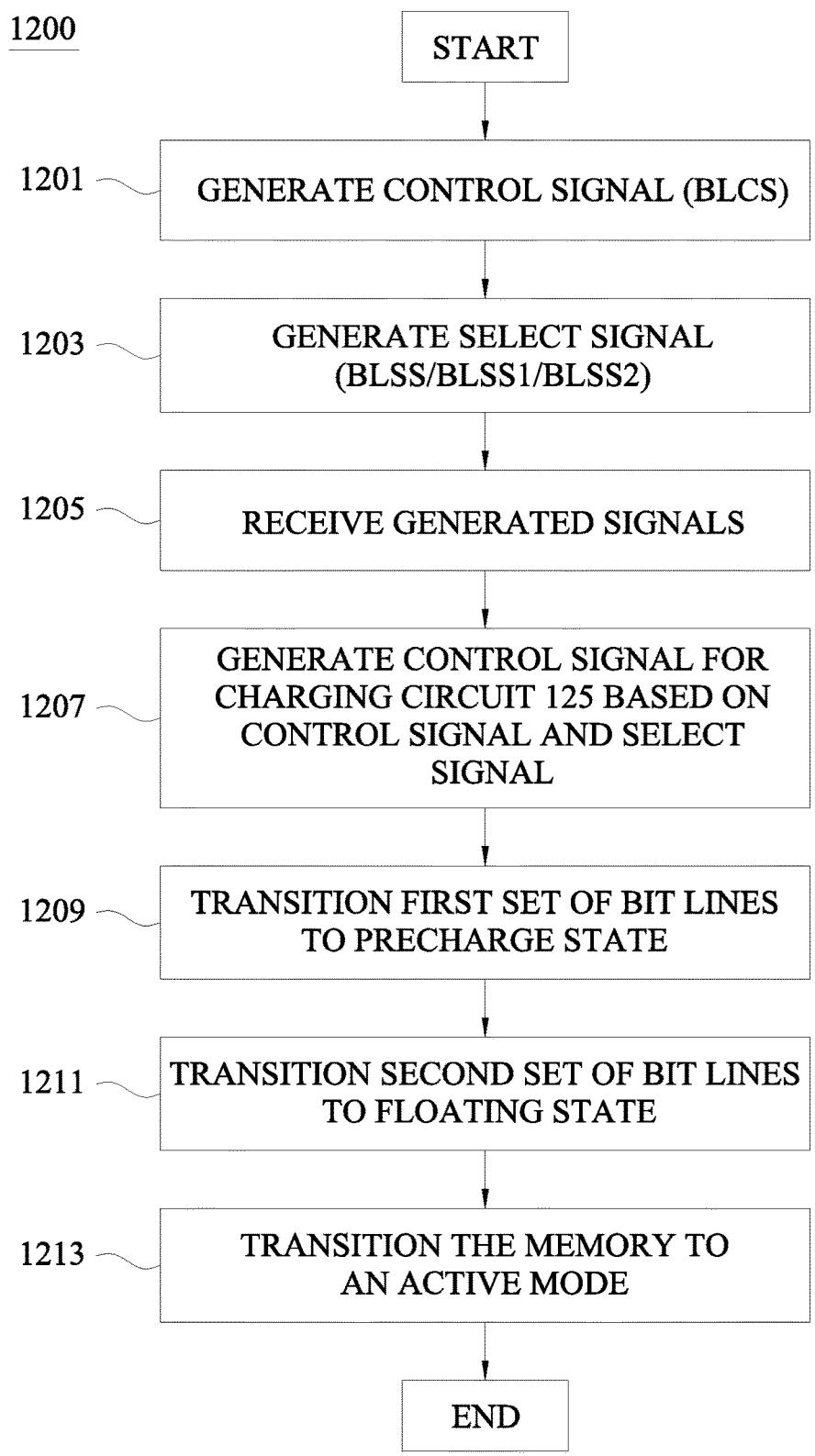
FIG. 12 is a flowchart of a method of controlling a bit line pair in a memory of FIG. 1-6, in accordance with one or more embodiments.

FIG. 12 is a flowchart of a method 1200 of controlling a bit line pair, in accordance with one or more embodiments. Method 1200 implements steps that are used for partial BL (or column-based) floating sleep power management of a semiconductor device such as memory 100. In step 1201, a control signal (e.g., signal BLCS) is generated. In step 1203, one or more select signals (e.g., BLSS, BLSS1, and/or BLSS2) are generated. The control signal and the select signals are generated by, for example, a control circuit (e.g., control circuit 111 in FIG. 1 or control circuit 411 in FIG. 4). In step 1205, the bit line control signal and the one or more bit line select signals are received by one or more I/O control circuits (e.g., I/O control circuits 113). In step 1207, the I/O control circuits generate control signals to control corresponding charging circuits (e.g., 125) based on the control signal and the select signal. In step 1209, if the control signal indicates that one or more bit lines are to be placed in a precharge state and the select signal indicates that a set of bit lines are to be controlled by an I/O control circuit, then the I/O control circuit transitions the identified set of bit lines to a precharge state. The set of bit lines are maintained at a predefined voltage by the I/O control circuits in the precharge state. In step 1211, the I/O control circuits transition the set of bit lines not identified by the select signal to a floating state. The sets of bit lines are maintained in respective precharge states and floating states until the control circuit transitions the memory to an active mode in step 1213. In some embodiments, one or more of the bit lines included in a bit line pair are caused to separately be placed in the precharge state if the control circuits include a positive feedback circuit such as positive feedback circuit PF.

Figure 13:
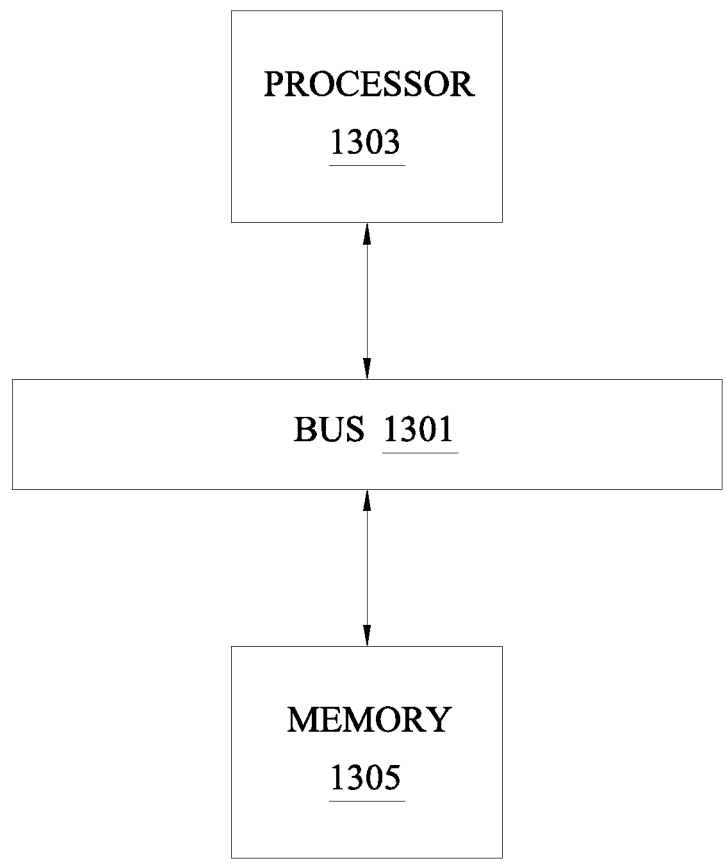
FIG. 13 is a functional block diagram of a computer or processor-based system upon which or by which an embodiment is implemented.

FIG. 13 is a functional block diagram of a computer or processor-based system 1300 upon which or by which an embodiment is implemented.

Processor-based system 1300 is programmable to cause a bit line and/or a complementary bit line to carry a precharge voltage, as described herein, and includes, for example, a bus 1301, a processor 1303, and a memory 1305.

In some embodiments, the processor-based system is implemented as a single "system on a chip." Processor-based system 1300, or a portion thereof, includes devices for causing a bit line or a complementary bit line to carry a predefined voltage. In some embodiments, the processor-based system 1300 includes a communication device such as bus 1301 for transferring information and/or instructions among the components of the processor-based system 1300. Processor 1303 is connected to the bus 1301 to obtain instructions for execution and process information stored in, for example, the memory 1305. In some embodiments, the processor 1303 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 1303. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 1303 performs a set of operations on information as specified by a set of instructions stored in memory 1305 related to causing a bit line or a complementary bit line to carry a precharge voltage. The execution of the instructions causes the processor to perform specified functions.

The processor 1303 and accompanying components are connected to the memory 1305 via the bus 1301. The memory 1305 includes one or more of dynamic memory and static memory for storing executable instructions that when executed perform the steps described herein to cause a bit line or a complementary bit line to carry a precharge voltage. The memory 1305 also stores the data associated with or generated by the execution of the steps.

In one or more embodiments, the memory 1305, such as a random access memory (RAM) or any other dynamic storage device, stores information including processor instructions for causing a bit line or a complementary bit line to carry a precharge voltage. RAM allows a unit of information stored at a location called a memory address to be stored and retrieved independently of information at neighboring addresses. The memory 1305 is also used by the processor 1303 to store temporary values during execution of processor instructions. In various embodiments, the memory 1305 is a read only memory (ROM) or any other static storage device coupled to the bus 1301 for storing information, including instructions. Some memory is composed of volatile storage that loses the information stored thereon when power is lost. In some embodiments, the memory 1305 is a non-volatile (persistent) storage device, such as a magnetic disk, optical disk or flash card, for storing information, including instructions, that persists even when power supplied to the memory 1305 is turned off.

The term "computer-readable medium" as used herein refers to any medium that participates in providing information to processor 1303, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read.

In one embodiment, a memory includes a first set of memory cells that are coupled between a first data line and a second data line. The memory includes a first I/O circuit coupled to the first data line and the second data bit line. The first I/O circuit is also coupled to a first control line to receive a first control signal and is further to a first select line to receive a first select signal. The first I/O circuit is configured to selectively decouple the first data line and the second data line from the first I/O circuit during a sleep mode based on the first control signal and the first select signal.

In another embodiment, a memory includes a first set of memory cells that are coupled between a first data line and a second data line. The memory includes a first I/O circuit coupled to the first data line and the second data line. The first I/O circuit is also coupled to a first control line to receive a first control signal and coupled to a first select line to receive a first select signal. The first I/O circuit is configured to enable precharge of the first data line and the second data line to a predefined voltage based on the first control signal and the first select signal. The memory also includes a first feedback circuit coupled between the first data line and the second data bit line. The first feedback circuit is also coupled to the first I/O circuit and is configured to precharge one of the first data line and the second data line to the predefined voltage.

In another embodiment, the description describes a method of managing power in a memory. The method includes, when a state of a first signal places a memory array in a sleep mode, enabling a charging circuit to charge a first set of data lines to a predefined voltage and disabling a second set of data lines to be in a floating state. The method further includes, after charging the first set of data lines to the predefined voltage and when a state of the first signal places the memory array in an active mode, activating the memory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory, comprising:
 a first set of memory cells coupled between a first data line and a second data line;
 a charging circuit coupled to the first data line and the second data line; and
 a first input/output (I/O) circuit comprising a logic circuit having an output coupled to the charging circuit and configured to receive a first control signal and a first select signal during a memory sleep mode, wherein a state of an output signal at the output of the logic circuit is based on a comparison of the first control signal and the first select signal.

2. The memory of claim 1, wherein the first I/O circuit is configured to precharge the first data line and the second data line to a predefined voltage based on a first state of the output signal during the sleep mode,
 wherein the first set of memory cells stores data during the sleep mode, and
 wherein the first set of memory cells are not accessed during the sleep mode.

3. The memory of claim 1, further comprising a second set of memory cells coupled between a third data line and a fourth data line.

4. The memory of claim 3, wherein the first I/O circuit is configured to selectively couple the third data line and the fourth data line to a power supply node based on the first control signal and the first select signal.

5. The memory of claim 3, further comprising a second I/O circuit configured to selectively decouple the third data line and the fourth data line from a power supply node based on a state of the first select signal and a state of the first control signal.

6. The memory of claim 3, further comprising a second I/O circuit configured to selectively decouple the third data line and the fourth data line from a power supply node based on a state of a second select signal and a state of the first control signal.

7. The memory of claim 3, wherein:
 the first I/O circuit is configured to selectively decouple the third data line and the fourth data line from a power supply node based on a second select signal and the first control signal, the first I/O circuit being configured to precharge the third data line and the fourth data line to a predefined voltage during the sleep mode.

8. A memory, comprising:
 a first set of memory cells coupled between a first data line and a second data line;
 a first input/output (I/O) circuit comprising a logic circuit configured to selectively couple the first data line and the second data line to a power supply node during a sleep mode based on a comparison of a first control signal and a first select signal; and
 a first feedback circuit coupled between the first data line and the second data line, the first feedback circuit being configured to precharge one of the first data line and the second data line to a predefined voltage during the sleep mode.

9. The memory of claim 8, wherein the first feedback circuit is configured to precharge the first data line if a leakage from the first data line exceeds a leakage from the second data line, and to precharge the second data line if the leakage from the second data line exceeds the leakage from the first data line.

10. The memory of claim 9, wherein the leakage of the first data line is based on content stored in the first set of memory cells, and the leakage of the second data line is based on content stored in the first set of memory cells.

11. The memory of claim 9, wherein the first feedback circuit comprises a pair of cross coupled transistors configured to cause one of the first data line or the second data line to be coupled with a voltage source corresponding to the predefined voltage.

12. The memory of claim 9,
 wherein the first set of memory cells stores data during the sleep mode, and
 wherein the first set of memory cells is not accessed in the sleep mode.

13. The memory of claim 10, further comprising:
 a second set of memory cells coupled between a third data line and a fourth data line; and
 a second feedback circuit coupled between the third data line and the fourth data line, the second feedback circuit being configured to precharge one of the third data line or the fourth data line to the predefined voltage during the sleep mode.

14. The memory of claim 13, wherein the first I/O circuit is coupled to the third data line and the fourth data line, and
 wherein the first I/O circuit is configured to selectively decouple the third data line and the fourth data line from the power supply node based on the first select signal and the first control signal.

15. The memory of claim 13, further comprising a second I/O circuit configured to selectively decouple the third data line and the fourth data line from the power supply node based on the first select signal and the first control signal.

16. The memory of claim 13, further comprising a second I/O circuit configured to selectively decouple the third data line and the fourth data line from the power supply node based on the first control signal and a second select signal.

17. The memory of claim 13, wherein the first I/O circuit is configured to selectively decouple the third data line and the fourth data line from the power supply node based on the first control signal and the second select signal.

18. A method for managing power in a memory, comprising:
 when a state of a first signal places a memory array in a sleep mode, enabling a charging circuit to charge a first set of data lines to a predefined voltage and disabling a second set of data lines to be in a floating state; and
 after activating the memory when a state of the first signal places the memory array in an active mode, charging the second set of data lines to the predefined voltage.

19. The method of claim 18, further comprising selecting the first set of data lines to charge based on a leakage current from memory cells coupled to the first set of data lines and a leakage current from memory cells coupled to the second set of data lines.

20. The method of claim 19, further comprising, when a state of the first signal places the memory array in the sleep mode, another charging circuit disables the second set of data lines.

* * * * *